(12) United States Patent
Kubota et al.

(10) Patent No.: US 6,992,250 B2
(45) Date of Patent: Jan. 31, 2006

(54) ELECTRONIC COMPONENT HOUSING PACKAGE AND ELECTRONIC APPARATUS

(75) Inventors: Kouji Kubota, Somerset, NJ (US); Taizou Suemitsu, Inazawa (JP); Takeo Satake, Gamo-gun (JP); Akiko Matsuzaki, Gamo-gun (JP); Atsushi Ogasawara, Gamo-gun (JP); Nobuyuki Tanaka, Gamo-gun (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 11/067,518

(22) Filed: Feb. 25, 2005

(65) Prior Publication Data

US 2005/0207092 A1    Sep. 22, 2005

(30) Foreign Application Priority Data

Feb. 26, 2004  (JP) ............................. 2004-052535
Jul. 28, 2004  (JP) ............................. 2004-220838

(51) Int. Cl.
    *H01L 23/02* (2006.01)
(52) U.S. Cl. .................. 174/52.4; 174/52.2; 257/698
(58) Field of Classification Search ............ 174/52.2, 174/52.4; 257/698
    See application file for complete search history.

(56) References Cited

U.S. PATENT DOCUMENTS

| 3,404,215 | A  | * | 10/1968 | Burks et al. ............... 174/52.2 |
| 5,294,751 | A  | * | 3/1994 | Kamada .................... 174/52.4 |
| 6,528,724 | B1 | * | 3/2003 | Yoshida et al. ............ 174/52.4 |
| 6,884,938 | B2 | * | 4/2005 | Aoyagi ...................... 174/52.4 |
| 6,906,412 | B2 | * | 6/2005 | Furukubo et al. ........... 257/698 |
| 6,919,625 | B2 | * | 7/2005 | O'Shea et al. ............. 174/52.4 |

FOREIGN PATENT DOCUMENTS

JP          05-335431          11/1998

* cited by examiner

*Primary Examiner*—Dean A. Reichard
*Assistant Examiner*—Adolfo Nino
(74) *Attorney, Agent, or Firm*—Hogan & Hartson LLP

(57) ABSTRACT

An electronic component housing package includes a base body made of a metal; a rectangular frame body made of a metal; an input/output terminal made of insulating material, which has line conductor for electrically conductively connecting the interior and exterior of the frame body; and an input/output terminal mounting portion, into which input/output terminal is fitted and which is formed as a notch extending across two adjacent corners of a frame body's lower part. The input/output terminal is so configured that its opposed end-face pair at two corners are made flush with opposed outer-side-surface pair including two corners of frame body, and that metal layer is applied to both of a part of an input/output terminal's end-face extending along the mounting portion and another part thereof extending along the base body.

14 Claims, 10 Drawing Sheets

ELECTRONIC COMPONENT HOUSING PACKAGE AND ELECTRONIC APPARATUS

BACKGROUND OF THE INVENTION

1. Field of the Invention

The present invention relates to an electronic component housing package for housing therein an electronic component, and an electronic apparatus.

2. Description of the Related Art

In keeping with speeding-up and an increase in size in regard to information processing, diligent efforts have been expended to make improvements to electronic apparatuses for use in information processing systems so that a larger amount of electric power can be handled at higher frequencies. For example, active semiconductor elements such as a schottky-barrier type field-effect transistor formed of a gallium (Ga) arsenic (As) semiconductor element and the like have been developed and undergone new improvements in handling a larger amount of electric power in high-frequency regions, for the replacement of conventional semiconductor elements made of silicon(Si).

Shown in FIG. 10 is an example of an electronic component housing package (hereafter, referred also to simply as "package") of conventional design for housing therein a semiconductor element that handles a large amount of electric power at high frequencies. FIG. 10 is an exploded perspective view showing a conventional electronic component housing package and electronic apparatus. In the figure, reference numeral 21 represents a base body; 22 represents a frame body; and 23 represents an input/output terminal.

The package shown in FIG. 10 is mainly composed of the rectangular-shaped platy base body 21; the frame body 22 arranged on the base body 21; and the input/output terminal 23 arranged on the base body 21 and fixed to the frame body 22.

For example, the base body 21 is made of a material which exhibits excellent thermal conductivity, such as a copper (Cu)-Tungsten (W) metal. The base body 21 acts as an earth electrode and also as a heat-dissipating plate for an electronic component 25. The frame body 22 is made of a metal such as an iron (Fe)-nickel (Ni)-cobalt (Co) alloy having a rectangular planar configuration. The frame body 22 is fixed to the top surface of the base body 21 with use of a brazing filler material such as silver (Ag) brazing filler. The frame body 22 is smaller in length than the base body 21 but is substantially equal in width to the base body 21. Moreover, the frame body 22 has, on its one longitudinal side surface, a notch 22a formed so as to extend widthwise across the opposed side surfaces thereof.

The frame body 22 constitutes, together with the base body 21, a cavity for accommodating the electronic component 25 inside. The input/output terminal 23 is mainly composed of a plate portion 23b having a rectangular planar configuration; line conductors 23a formed on the plate portion 23b; and an upright wall portion 23c disposed uprightly on the plate portion 23b. The plate portion 23b is made of an insulating material such as ceramics. The line conductor 23a is made of, for example, a high-melting-point metal such as W, molybdenum (Mo), or manganese (Mn). As shown in FIG. 10, the upright wall portion 23c is arranged on the midportion of the plate portion 23b perpendicularly with respect to the line conductor 23a, with its both ends bent to extend in parallel with the line conductor 23a. The upright wall portion 23c, which is made of an insulating material alike to that used for the plate portion 23b, is formed integrally with the plate portion 23b.

As shown in FIG. 10, the input/output terminal 23 is, at its plate portion 23b, fixed onto the base body 21, with the upright wall portion 23c fitted into the notch 22a of the frame body 22. In this way, the notch 22a is air-tightly sealed. Note that the input/output terminal 23 is brazed to the base body 21 and also to the notch 22a through a metallized layer (not shown) formed on the bottom surface thereof.

Then, an electronic component 25 such as a field-effect transistor is placed in the electronic component housing package as follows. As shown in FIG. 10, the electronic component 25 is fixed to a placement portion 21a formed on the base body 21 with use of a brazing filler material. Next, an electrode of the electronic component 25 is connected to the line conductor 23a included in the input/output terminal 23 by electrical connecting means 26 such as a bonding wire. After that, a lid body 24 is joined onto the frame body 22 by brazing, seam welding, or the like method, thereby air-tightly sealing the package. Thereupon, an electronic apparatus is realized.

In the electronic component housing package and the electronic apparatus such as described hereinabove, since the input/output terminal 23 does not jut out from the frame body 22, it has been possible to achieve miniaturization.

As a related art, there is Japanese Patent Publication JP-B2 2854460.

However, the conventional construction as shown in FIG. 10 poses the following problems. At the time of brazing the input/output terminal 23 to the base body 21 as well as the frame body 22, the brazing filler material tends to flow out of the joint portion and remain at each exposed end-face of the input/output terminal 23. In this case, after fixing the input/output terminal 23 to the base body 21 and also to the frame body 22 by brazing, a stress may be produced due to the difference in thermal expansion between a large-volume clot of the brazing filler material and the input/output terminal 23. If the input/output terminal 23 is seriously subjected to the stress, damage will result such as a crack. Owing to the damage occurring in the input/output terminal 23, the package cannot be hermetically insulated from the exterior thereof, or the line conductor 23a formed on the input/output terminal 23 will suffer from a break. As a result, the electronic component 25 housed within the package cannot be operated properly.

Moreover, the package has recently come to have, as the electronic component 25 to be housed therein, a component which is operated with high-frequency signals. Accompanying this trend, excellent high-frequency signal transmission characteristics have been sought after in the line conductor 23a. However, in the input/output terminal 23 employed in the conventional construction thus far described, the ground potential with respect to the line conductor 23a is insufficient. Thus, when a high-frequency signal is transmitted to the line conductor 23a, electrical transmission loss such as return loss and insertion loss is caused, whereby making it impossible to transmit the high-frequency signal with high efficiency.

SUMMARY OF THE INVENTION

The invention has been devised in view of the above-described problems with the conventional art, and accordingly its object is to provide a compact electronic component housing package, and an electronic apparatus that are excellent in high-frequency characteristics, in which an input/ output terminal is protected against breakage and an electronic component can be operated normally and stably for a longer period of time.

The invention provides an electronic component housing package comprising:
- a base body made of a metal that has, on its upper principal surface, a placement portion for emplacing thereon an electronic component;
- a rectangular-shaped frame body made of a metal disposed on the upper principal surface of the base body so as to surround the placement portion;
- an input/output terminal composed of an insulating material that has a line conductor for electrically conductively connecting an interior and exterior of the frame body; and
- an input/output terminal mounting portion into which the input/output terminal is fitted and which is formed as a notch extending across two adjacent corners of a lower part of the frame body,
- wherein the input/output terminal is so configured that its opposed end-face pair at two corners are made flush with opposed outer-side-surface pair including two corners of the frame body, or are each located between the outer-side-surface and inner-side-surface of the frame body,
- and wherein, in the input/output terminal, a metal layer is applied to both of a part of the end-face which extends along the input/output terminal mounting portion and a part thereof which extends along the base body, respectively.

The invention provides an electronic component housing package comprising:
- a base body made of a metal that has, on its upper principal surface, a placement portion for emplacing thereon an electronic component;
- a rectangular-shaped frame body made of a metal disposed on the upper principal surface of the base body so as to surround the placement portion;
- an input/output terminal mounting portion formed as a notch extending across two adjacent corners of a lower part of the frame body; and
- an input/output terminal composed of an insulating material having a line conductor for electrically conductively connecting an interior and exterior of the frame body; and
- an input/output terminal mounting portion into which the input/output terminal is fitted and which is formed as a notch extending across two adjacent corners of a lower part of the frame body,
- wherein the input/output terminal is so configured that its opposed end-face pair at two corners are located externally of opposed outer-side-surface pair including two corners of the frame body,
- and wherein, in the input/output terminal, a metal layer is applied to both of a part of the top surface which is fitted into the frame body and a part thereof which is located externally of the outer-side-surface pair.

In the invention, the metal layer is applied to substantially the entire area of the end-face of the input/output terminal.

In the invention, the input/output terminal is rectangular-shaped as viewed plane-wise, the line conductor is formed on a top surface of the input/output terminal, and the metal layer is applied to substantially the entire area of the end-face of the input/output terminal, excluding an edge between the end-face and a part of the top surface of the input/output terminal which is exposed outside the frame body.

In the invention, the input/output terminal is composed of a plate portion having the line conductor formed on its top surface and a upright wall portion formed on the plate portion, and is rectangular-shaped as viewed plane-wise, and the metal layer is applied to the entire area of the end-face of the input/output terminal, excluding an edge between the end-face and a part of the top surface of the plate portion which is exposed outside the frame body.

In the invention, the input/output terminal is rectangular-shaped, as viewed plane-wise, the line conductor is formed a top surface and a bottom surface of the input/output terminal, and the metal layer is applied to substantially the entire area of the end-face of the input/output terminal, excluding an edge between the end-face and a part of the top surface which is exposed outside the frame body as well as an edge between the end-face and a part of the bottom surface which is exposed outside the frame body.

In the invention, the input/output terminal is composed of a plate portion having the line conductors formed on its top and bottom surfaces and a upright wall portion formed on the plate portion, and is rectangular-shaped as viewed plane-wise, and the metal layer is applied to the entire area of the end-face of the input/output terminal, excluding the edge between the end-face and a part of the top surface of the plate portion which is exposed outside the frame body as well as an edge between the end-face and a part of the bottom surface which is exposed outside the frame body.

In the invention, the metal layer is applied to only a part of the end-face of the input/output terminal which extends along the joint portion with the base body and a part thereof which extends along the joint portion with the frame body.

In the invention, the metal layer has, on its surface, a plurality of grooves extending in a direction perpendicular to an outer periphery of the end-face of the input/output terminal.

The invention provides an electronic apparatus comprising:
- the electronic component housing package of the invention;
- an electronic component emplaced on the placement portion and electrically connected to the line conductor; and
- a lid body attached to the top surface of the frame body.

According to the invention, the electronic component housing package is composed of: a base body made of a metal that has, on its upper principal surface, a placement portion for emplacing thereon an electronic component; a rectangular-shaped frame body made of a metal disposed on the upper principal surface of the base body so as to surround the placement portion; an input/output terminal composed of an insulating material having a line conductor for electrically conductively connecting an interior and exterior of the frame body; and an input/output terminal mounting portion formed as a notch extending across two adjacent corners of a lower part of the frame body, the input/output terminal being fitted into the input/output terminal mounting portion. The input/output terminal is so configured that its opposed end-face pair at two corners are made flush with the opposed outer-side-surface pair including two corners of the frame body, or are each located between the outer-side-surface and inner-side-surface of the frame body. Moreover, in the input/output terminal, a metal layer is applied to both of a part of the end-face which extends along the input/output terminal mounting portion and a part thereof which extends along the base body. Further, the metal layer may be applied to substantially the entire area of the end-face of the input/output terminal, and the metal layer may be applied to only a part of the end-face of the input/output terminal which extends along the joint portion with the base body and a part of the end-face of the input/output terminal which extends along the joint portion with the frame body. Accordingly, at the time of brazing the input/output terminal to the base body as well as the frame body, the brazing filler material flowing out of the joint portion is effectively allowed to spread wetly over the surface of the metal layer so as not to remain in the vicinity of the joint portion between the input/output terminal and the base body as well as the frame body. Hence, the input/output terminal can be prevented effectively from being seriously affected, at its end-face close to the joint portion with the base body as well as the frame body, by the stress resulting from the difference in thermal expansion between the input/output terminal and the brazing filler material. As a result, several advantages are gained for the electronic component housing package: the input/output terminal can be protected from damage such as a crack effectively; the electronic component housing package is hermetically insulated from the exterior thereof; the line conductor formed on the input/output terminal is free from a break; and the to-be-housed electronic component can be operated normally and stably for a longer period of time.

Moreover, the metal layer applied to the end-face of the input/output terminal serves also as a ground potential with respect to the line conductor. Thus, even if a high-frequency signal is transmitted to the line conductor, occurrence of electrical transmission loss such as return loss and insertion loss can be avoided; wherefore highly efficient transmittal of high-frequency signals can be achieved.

According to the invention, the electronic component housing package is composed of: a base body made of a metal that has, on its upper principal surface, a placement portion for emplacing thereon an electronic component; a rectangular-shaped frame body made of a metal disposed on the upper principal surface of the base body so as to surround the placement portion; and an input/output terminal composed of an insulating material having a line conductor for electrically conductively connecting an interior and exterior of the frame body; and an input/output terminal mounting portion into which the input/output terminal is fitted and which is formed as a notch extending across two adjacent corners of a lower part of the frame body. The input/output terminal is so configured that its opposed end-face pair at two corners are located externally of the opposed outer-side-surface pair including two corners of the frame body. Moreover, in the input/output terminal, a metal layer is applied to both of a part of the top surface which is fitted into the frame body and a part thereof which is located externally of the outer-side-surface pair. Further, the metal layer may be applied to substantially the entire area of the end-face of the input/output terminal, and the metal layer may be applied to only a part of the end-face of the input/output terminal which extends along the joint portion with the base body and a part of the end-face of the input/output terminal which extends along the joint portion with the frame body. Accordingly, at the time of brazing the input/output terminal to the base body as well as the frame body, the brazing filler material flowing out of the joint portion is effectively allowed to spread wetly over the metal layer formed on both of a part of the top surface of the input/output terminal which is fitted into the frame body and a part thereof which is located externally of the outer-side-surface pair, so as not to remain at each exposed end-face of the input/output terminal. Hence, the input/output terminal can be prevented effectively from being seriously affected, at its end-face close to the joint portion with the base body as well as the frame body, by the stress resulting from the difference in thermal expansion between the input/output terminal and the brazing filler material. As a result, several advantages are gained for the electronic component housing package: the input/output terminal can be protected from damage such as a crack effectively; the electronic component housing package is hermetically insulated from the exterior thereof; the line conductor formed on the input/output terminal is free from a break; and the to-be-housed electronic component can be operated normally and stably for a longer period of time.

Moreover, the metal layer serves also as a ground potential with respect to the line conductor. Thus, even if a high-frequency signal is transmitted to the line conductor, occurrence of electrical transmission loss such as return loss and insertion loss can be avoided; wherefore highly efficient transmittal of high-frequency signals can be achieved.

According to the invention, the input/output terminal is rectangular-shaped, as viewed plane-wise, and has an upright wall portion formed on a plate portion having the line conductor formed on its top surface, and the metal layer is applied to the entire area of the end-face of the input/output terminal, excluding the edge between the end-face and a part of the top surface of the plate portion which is exposed outside the frame body. Accordingly, even in the down-sized and integrated input/output terminal in which the line conductor is formed near the end-face thereof, it is possible to avoid occurrence of electrical short-circuiting between the line conductor and the metal layer applied to the end-face of the input/output terminal. Therefore, the area of the metal layer applied to the end-face of the input/output terminal can be made as large as possible, and thus the ground potential with respect to the line conductor can be intensified significantly. Hence, even if a high-frequency signal is transmitted to the line conductor, occurrence of electrical transmission loss such as return loss and insertion loss can be prevented effectively; wherefore highly efficient transmittal of high-frequency signals can be achieved.

According to the invention, the input/output terminal is rectangular-shaped, as viewed plane-wise, and is composed of a plate portion having a line conductor formed on its top and bottom surfaces and an upright wall portion formed thereon, and the metal layer is applied to the entire area of the end-face of the input/output terminal, excluding the edge between the end-face and a part of the top surface which is exposed outside the frame body, as well as the edge between the end-face and a part of the bottom surface which is exposed outside the frame body. Accordingly, even in the down-sized and integrated input/output terminal in which the line conductor is formed near the end-face thereof, it is possible to avoid occurrence of electrical short-circuiting between the line conductor and the metal layer applied to the end-face of the input/output terminal. Therefore, the area of the metal layer applied to the end-face of the input/output terminal can be made as large as possible, and thus the ground potential with respect to the line conductor can be intensified significantly. Hence, even if a high-frequency signal is transmitted to the line conductor, occurrence of electrical transmission loss such as return loss and insertion loss can be prevented effectively; wherefore highly efficient transmittal of high-frequency signals can be achieved.

According to the invention, the metal layer of the input/output terminal has, on its surface, a plurality of grooves extending in a direction perpendicular to the outer periphery of the end-face of the input/output terminal. This makes it possible to allow the brazing filler material, which flows out of the joint portion between the input/output terminal and the base body as well as the frame body, to spread wetly along the grooves quite sufficiently by exploiting a capillary phenomenon, and thereby prevent formation of a large clot of the brazing filler material more effectively.

According to the invention, the electronic apparatus is composed of: the electronic component housing package of the invention; an electronic component emplaced on the placement portion and electrically connected to the line conductor; and a lid body attached to the top surface of the frame body. Taking advantage of the electronic component housing package of the invention, in the electronic apparatus, the electronic component contained therein can be normally and stably operated for a longer period of time with high operation reliability.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
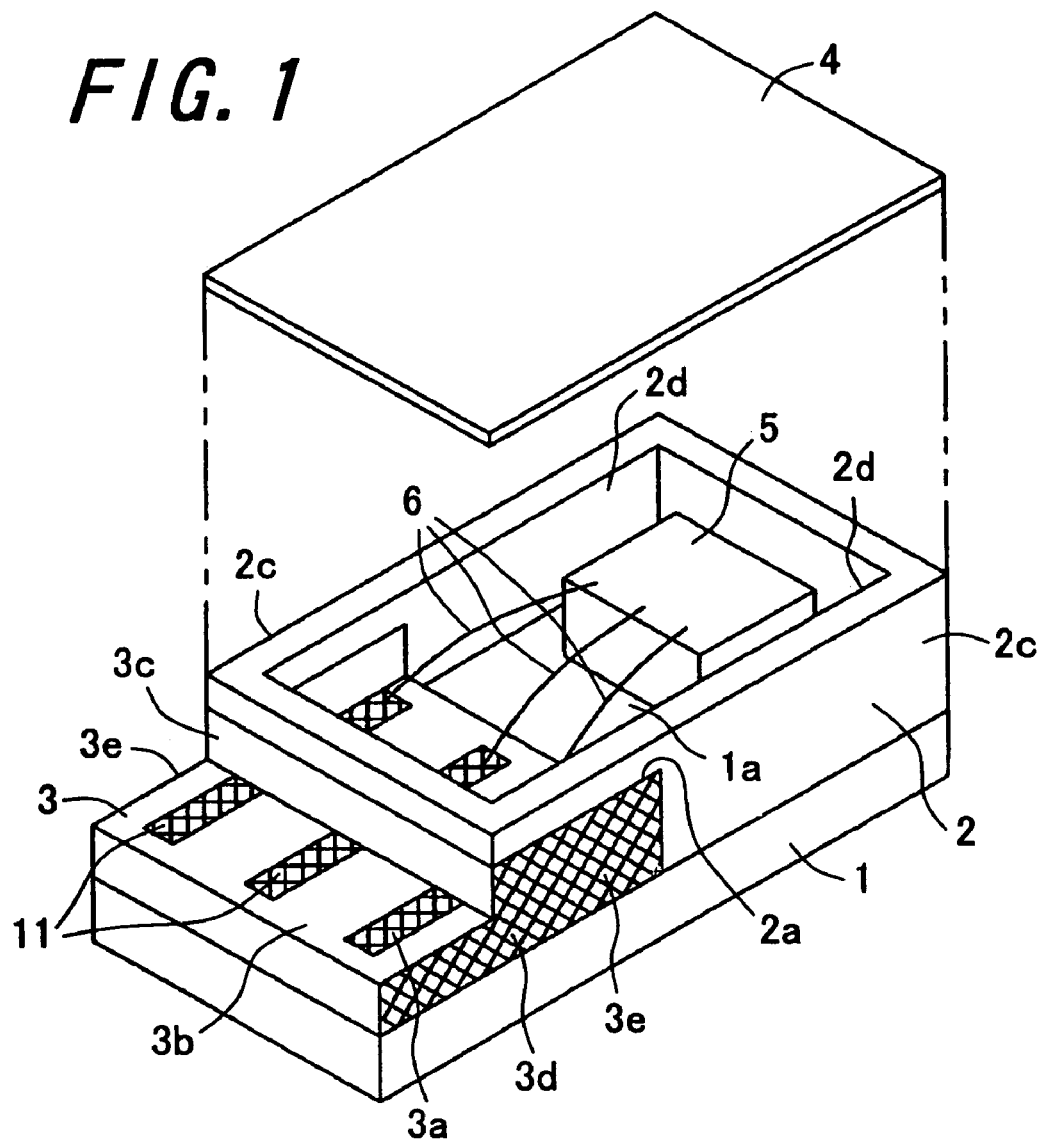
FIG. 1 is an exploded perspective view showing an electronic component housing package and an electronic apparatus, in accordance with a first embodiment of the invention.

Now referring to the drawings, preferred embodiments of the invention are described below.

Figure 2A:
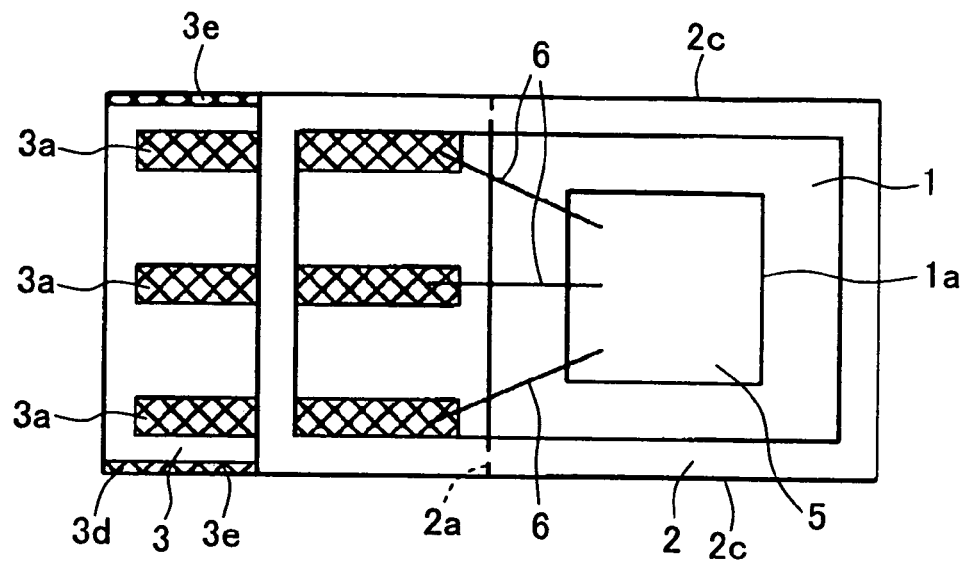
FIG. 2A is a plan view of the electronic component housing package shown in FIG. 1.
Figure 2B:
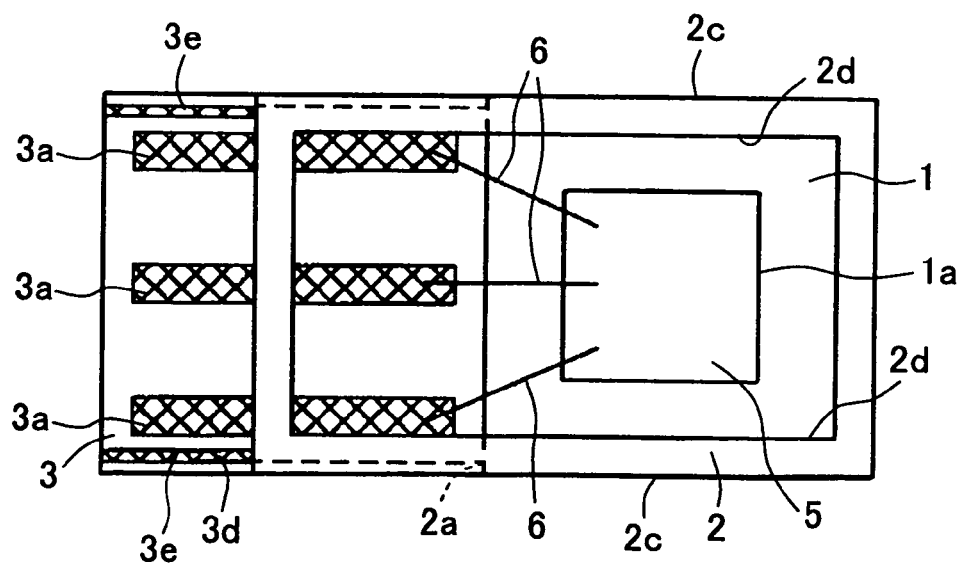
FIG. 2B is a plan view showing an electronic component housing package and an electronic apparatus in accordance with a second embodiment of the invention.
Figure 3A:
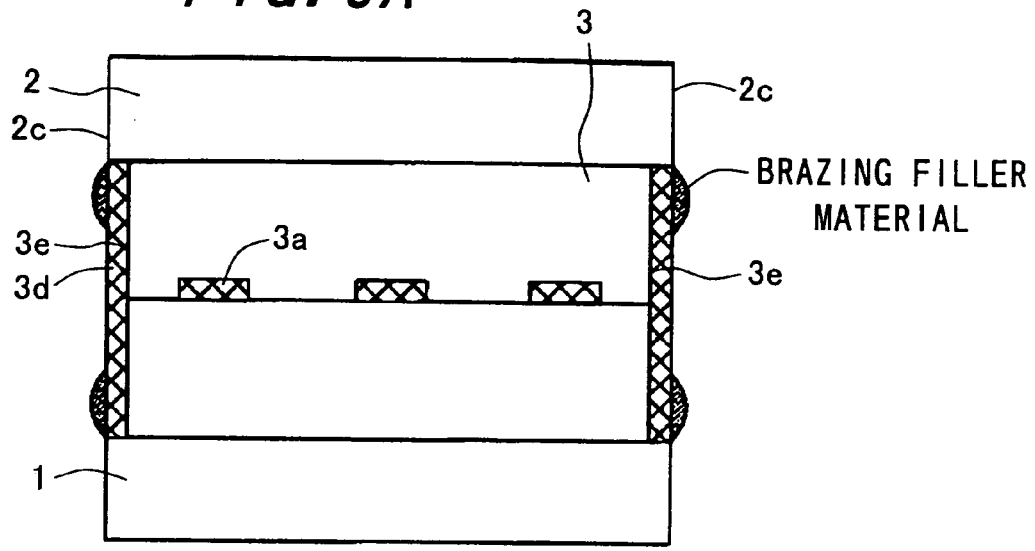
FIG. 3A is a front view of the electronic component housing package shown in FIG. 2A.
Figure 3B:
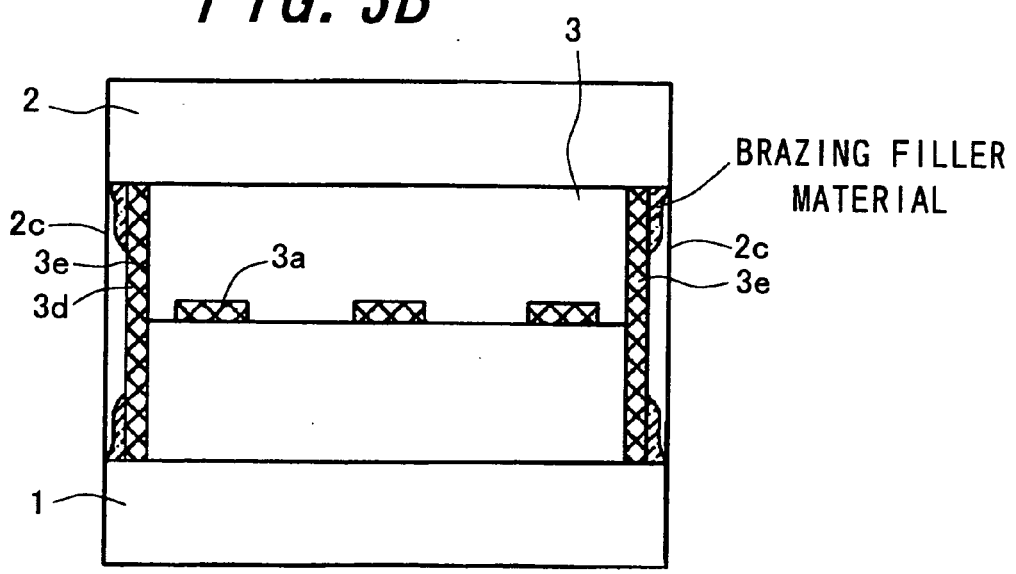
FIG. 3B is a front view of the electronic component housing package shown in FIG. 2B.
Figure 4A:
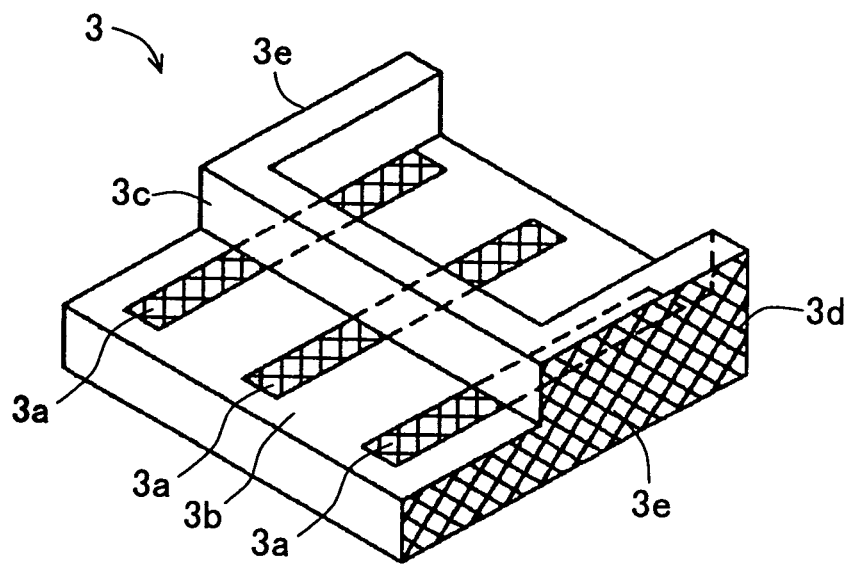
FIG. 4A is a perspective view showing an input/output terminal which is fittingly joined to the electronic component housing package shown in FIG.
Figure 4B:
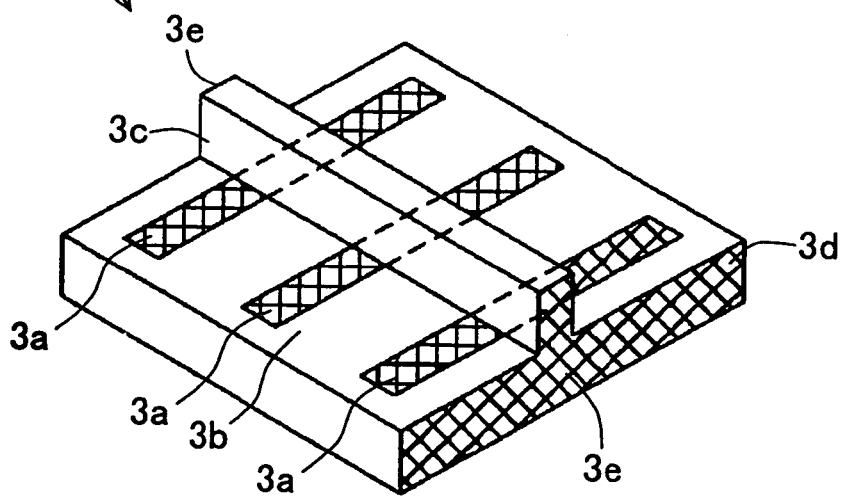
FIG. 4B is a perspective view showing another example of the input/output terminal which is fittingly joined to the electronic component housing package of the invention.
Figure 5:
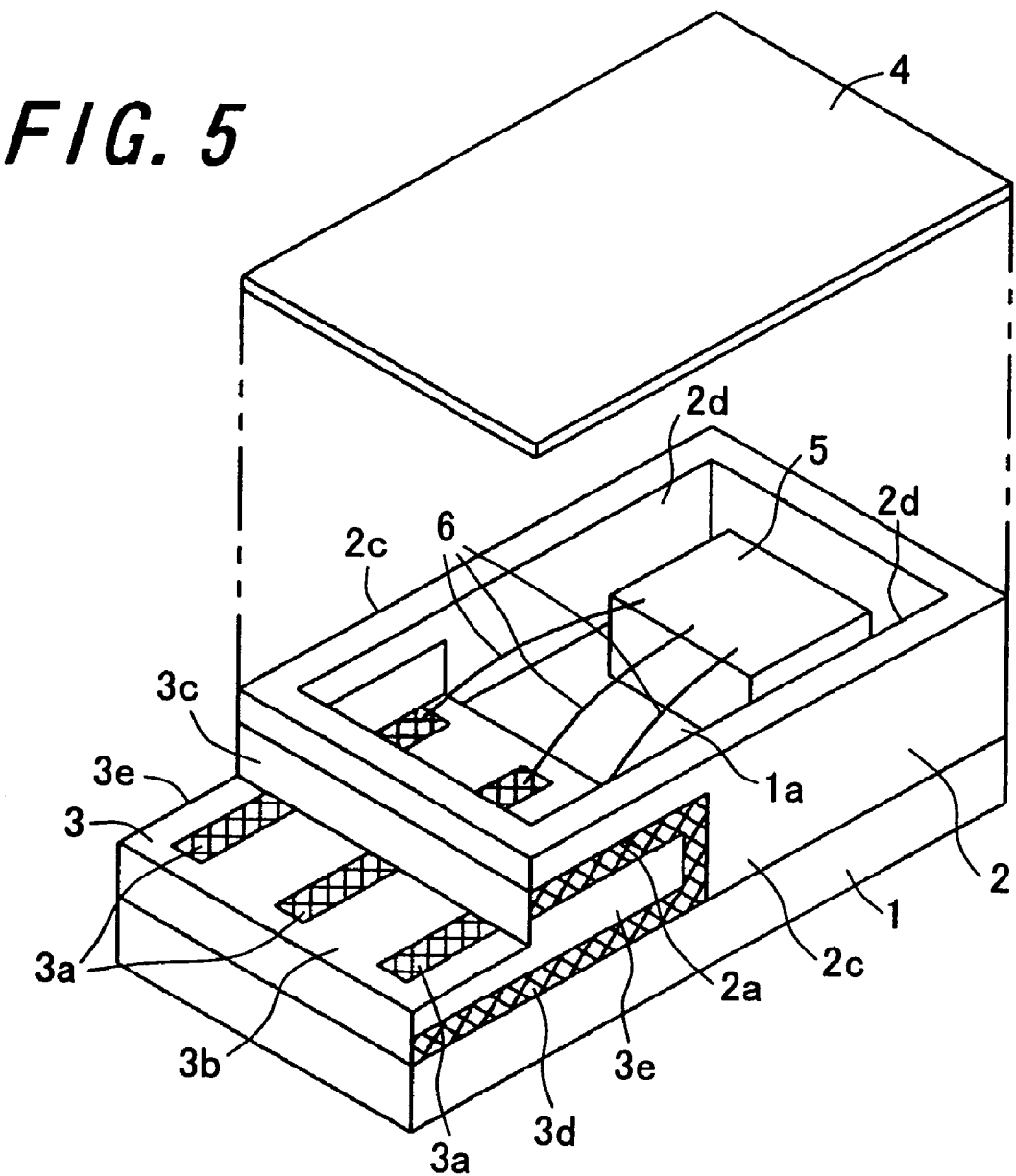
FIG. 5 is an exploded perspective view showing an electronic component housing package and an electronic apparatus in accordance with a third embodiment of the invention.
Figure 6:
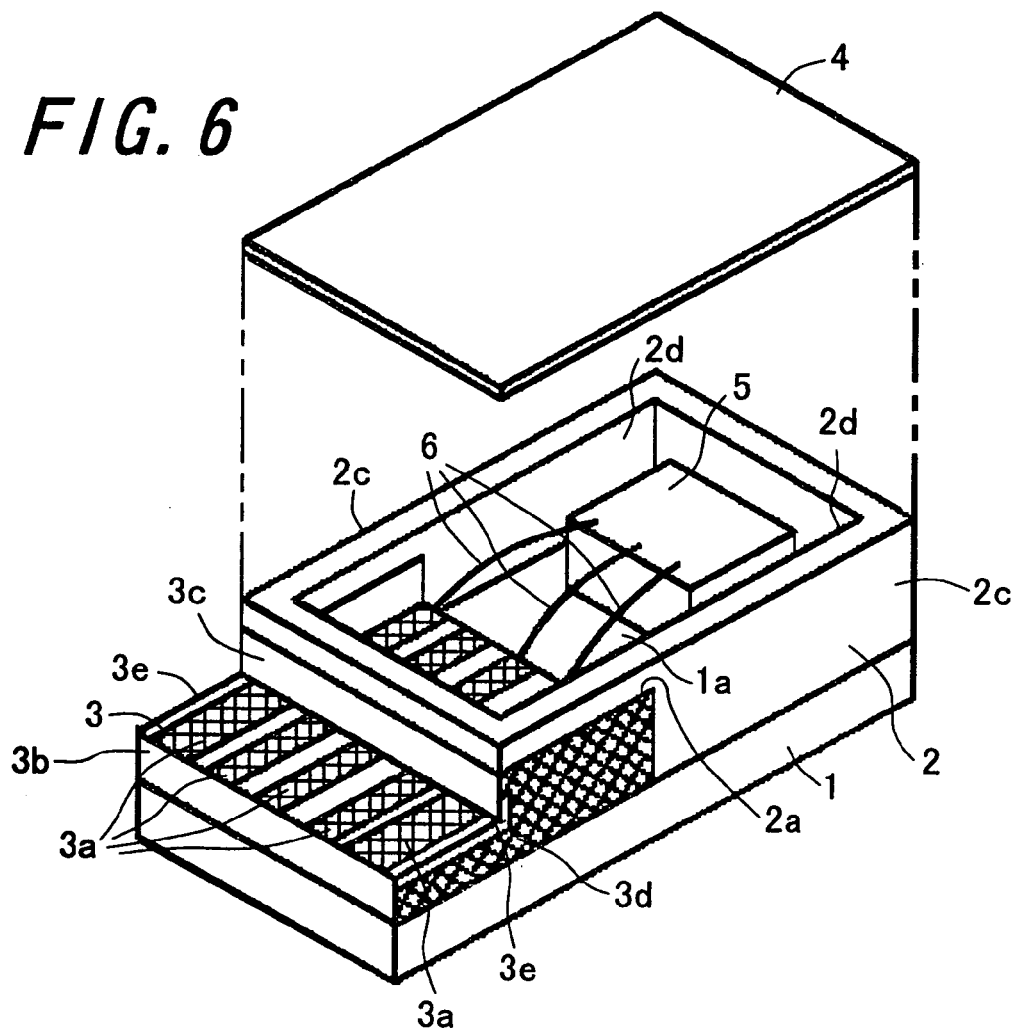
FIG. 6 is an exploded perspective view showing an electronic component housing package and an electronic apparatus in accordance with a fourth embodiment of the invention.
Figure 7:
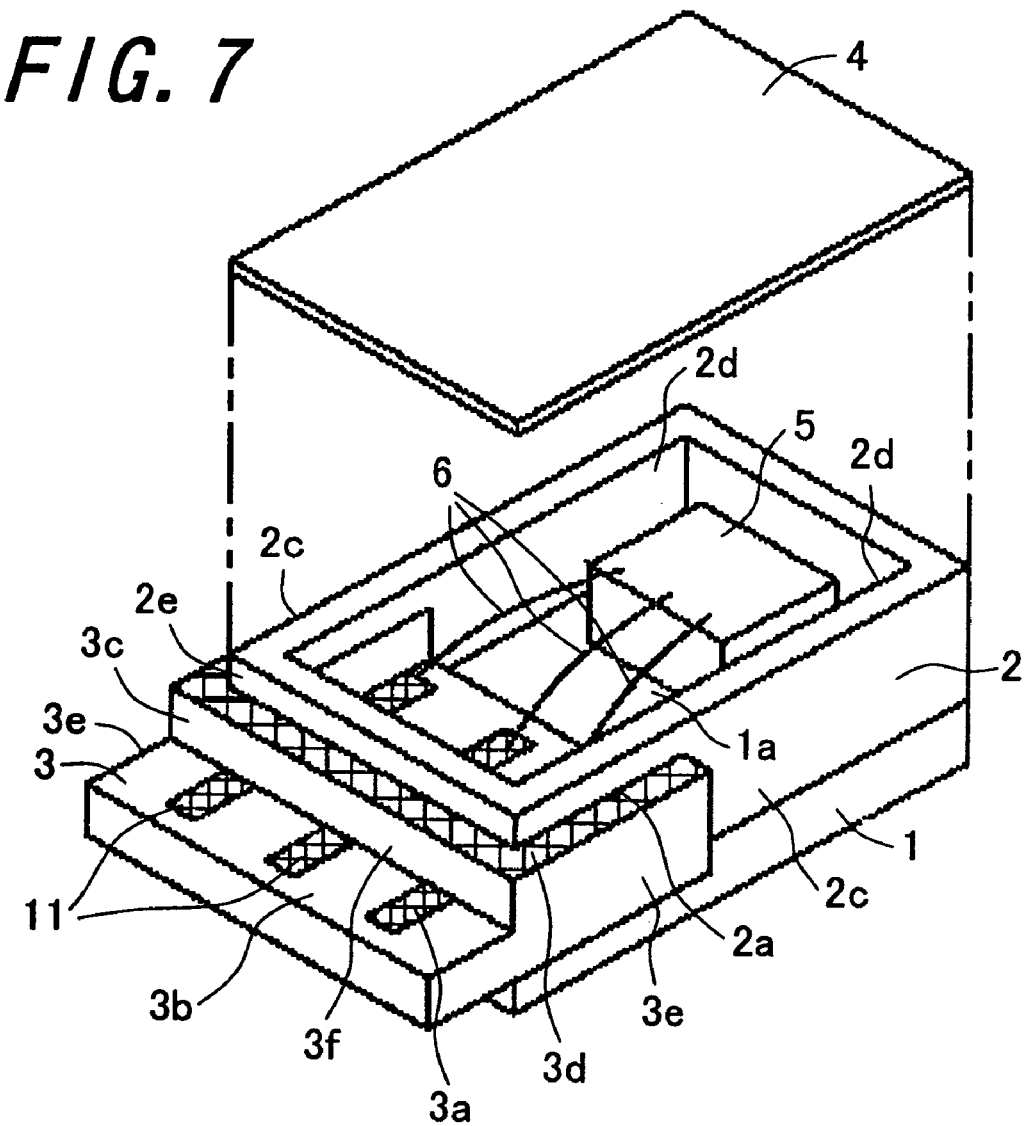
FIG. 7 is an exploded perspective view showing an electronic component housing package and an electronic apparatus in accordance with a fifth embodiment of the invention.
Figure 8:
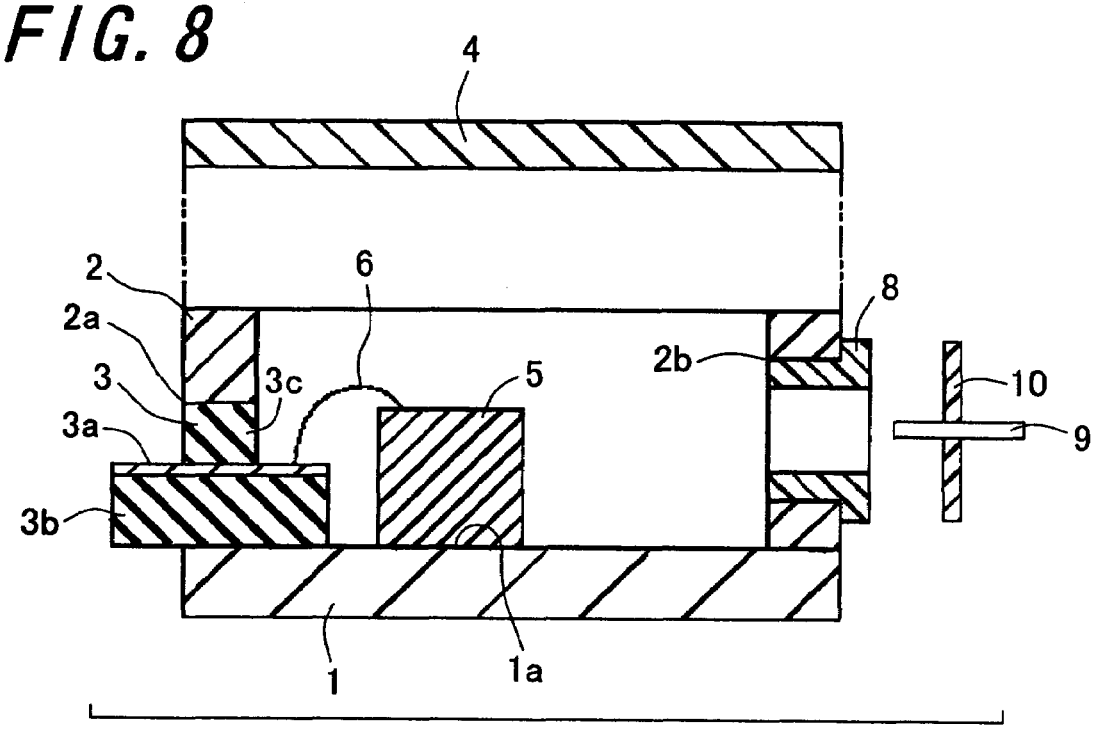
FIG. 8 is an cross sectional view showing an electronic component housing package and an electronic apparatus in accordance with a sixth embodiment of the invention.
Figure 9:
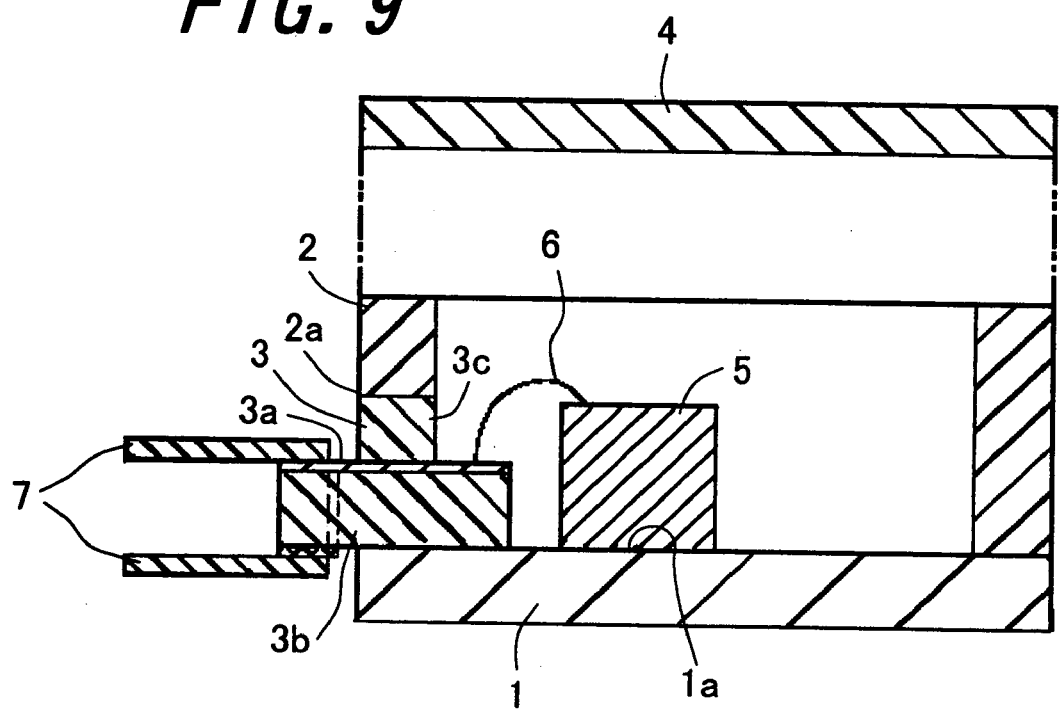
FIG. 9 is an cross sectional view showing an electronic component housing package and an electronic apparatus in accordance with a seventh embodiment of the invention.
Figure 10:
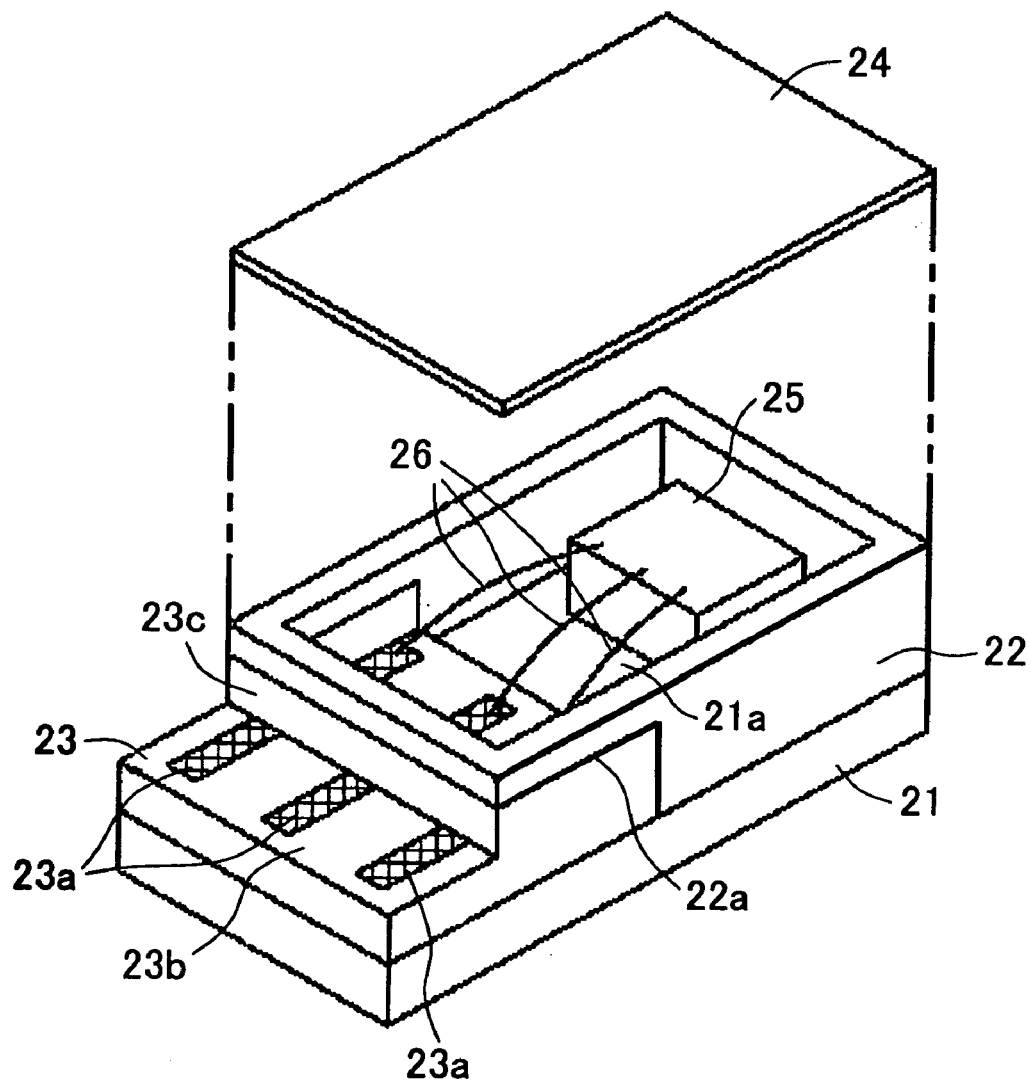
FIG. 10 is an exploded perspective view showing a conventional electronic component housing package and electronic apparatus.

Now, a detailed description will be given below as to an electronic component housing package embodying the invention. FIG. 1 is an exploded perspective view showing an electronic component housing package and an electronic apparatus in accordance with a first embodiment of the invention. FIGS. 2A and 3A are a plan view and a front view, respectively, of the electronic component housing package and the electronic apparatus. FIG. 4A is a perspective view showing an input/output terminal employed in the electronic component housing package shown in FIG. 1. FIG. 2B is a plan view showing an electronic component housing package and an electronic apparatus in accordance with a second embodiment of the invention. FIG. 3B is a front view thereof. FIG. 4B is a perspective view showing another example of the input/output terminal employed in the electronic component housing package. FIG. 5 is an exploded perspective view showing an electronic component housing package and an electronic apparatus in accordance with a third embodiment of the invention. FIG. 6 is an exploded perspective view showing an electronic component housing package and an electronic apparatus in accordance with a fourth embodiment of the invention. In addition, FIG. 7 is an exploded perspective view showing an electronic component housing package and an electronic apparatus in accordance with a fifth embodiment of the invention. FIG. 8 is an cross sectional view showing an electronic component housing package and an electronic apparatus in accordance with a sixth embodiment of the invention. FIG. 9 is an cross sectional view showing an electronic component housing package and an electronic apparatus in accordance with a seventh embodiment of the invention. In these figures, reference numeral 1 represents a base body; reference numeral 2 represents a frame body; and reference numeral 3 represents an input/output terminal. Basically, the base body 1, the frame body 2 and the input/output terminal 3 constitute an electronic component housing package for housing an electronic component 5 in the interior space thereof. Note that hatched areas in these figures, i.e. FIGS. 1, 2A, 2B, 3A, 3B, 4A, 4B and 5 to 7, do not indicate a cross section but indicate a portion in which a metal layer is formed. That is not to say that a portion shown as a non-hatched area has no metal layer.

As shown in these figures, the electronic component housing package (hereafter, occasionally referred to as "package") of the invention comprises a base body 1; a frame body 2; an input/output terminal 3; and a mounting portion 2a for the input/output terminal 3. The base body 1 is made of a metal and has, on its upper principal surface, a placement portion 1a for emplacing thereon an electronic component 5. The frame body 2 is composed of a rectangular-shaped metal member and is disposed on the upper principal surface of the base body 1 so as to surround the placement portion 1a. An input/output terminal 3 is composed of an insulating material and has a line conductor 3a for electrically conductively connecting the interior and exterior of the frame body 2. A mounting portion 2a of the input/output terminal 3 into which the input/output terminal 3 is fitted and which is formed as a notch extending across two adjacent corners of the lower part in the frame body 2. The input/output terminal 3 is so configured that its opposed end-face pair 3e at two corners are made flush with the opposed outer-side-surface pair 2c including two corners of the frame body 2 (refer to FIGS. 1, 2A and 3A), or are each located between the outer-side-surface 2c and inner-side-surface 2d of the frame body 2 (refer to FIGS. 2B and 3B). In addition, in the input/output terminal 3, a metal layer 3d is applied to both of a part of the end-face which extends along the mounting portion 2a of the input/output terminal 3 and a part thereof which extends along the base body 1.

In the package of the invention, alternatively, the input/output terminal 3 is so configured that its opposed end-face pair 3e at two corners are located externally of the opposed outer-side-surface pair 2c including two corners of the frame body 2. In addition, in the input/output terminal 3, the metal layer 3d is applied to both of a part of the top surface which is fitted into the frame body 2 and a part thereof which is located externally of the outer-side-surface pair 2c (refer to FIG. 7).

The base body 1 for constituting the package of the invention is made of a rectangular-shaped metal material, for example a Cu-based material such as oxygen-free Cu, Cu—W, or a Cu-molybdenum (Mo) alloy, or an Fe—Ni—Co alloy, or an Fe—Ni alloy. In particular, the Cu-based material (Cu, an alloy predominantly composed of Cu, or a Cu-impregnated metal) is desirable from the standpoint of enhancing the thermal conductivity of the base body 1. With excellent thermal conductivity, heat emanating from the electronic component 5 housed inside can be dissipated to outside with high efficiency.

The base body 1 is formed in a predetermined configuration by subjecting an ingot of the aforementioned metal to a conventionally-known metal processing method such as a rolling process or stamping process. It is preferable that the base body 1 has its surface coated with a 0.5 to 9 $\mu$m-thick Ni layer and a 0.5 to 5 $\mu$m-thick Au layer by the electrolytic plating method or electroless plating method. In this case, not only it is possible to protect the base body 1 against oxidative corrosion, but it is also possible to strengthen the fixation of the electronic component 5 achieved by brazing or the like method.

On the upper principal surface of the base body 1, the frame body 2 made of a metal such as an Fe—Ni—Co alloy is fixed by bonding so as to surround the placement portion 1a, with use of a brazing filler material such as Ag brazing filler or Ag—Cu brazing filler. The frame body 2 includes the input/output terminal 3 mounting portion 2a that is formed as a notch extending across two adjacent corners of the lower part thereof. The input/output terminal 3 is fittingly fixed to the region surrounded by the mounting portion 2a and the top surface of the base body 1 by brazing or the like method. In this way, the placement portion 1a is enclosed with the frame body 2 and the input/output terminal 3, thereby creating a cavity for accommodating the electronic component 5.

It is essential to a casing as the package constituted of the base body 1 and the frame body 2 only that the base body 1 be made larger than the frame body 2, as viewed plane-wise. For example, in FIGS. 1, 5, and 6, the plane-wise size of the base body 1 conforms to the size of a combination of the frame body 2 and the input/output terminal 3. Otherwise, as shown in FIGS. 7, 8, and 9, the base body 1 and the frame body 2 may be of equal plane-wise size. In this case, part of a plate portion 3b of the input/output terminal 3 may protrude externally of the frame body 2 and the base body 1.

It is preferable that, as shown in FIGS. 1, 5, and 6, the plane-wise size of the base body 1 conforms to the size of a combination of the frame body 2 and the input/output terminal 3. In this case, the bottom surface of the input/output terminal 3 is supported on the base body 1, thereby lending stiffening to the input/output terminal 3. Therefore, for example, at the time of connecting the line conductor 3a external to the frame body 2 to a wiring conductor of an external electric circuit board with use of a bonding wire or the like, even if an external force is applied to the part of the input/output terminal 3 which is situated outside the frame body 2, the input/output terminal 3 becomes resistant to breakage. As a result, at the time of connecting the line conductor 3a of the input/output terminal 3 to the wiring conductor of the external electric circuit board, there is no risk of the input/output terminal 3 suffering from breakage. Thus, the package can be kept sealed air-tightly; wherefore the electronic component 5 can be operated normally and stably for a longer period of time. Moreover, in this structure, since the input/output terminal 3 has its entire bottom surface covered with the base body 1 made of a metallized layer formed for brazing and a metal, it follows that the line conductor 3a is grounded, throughout its length, to the base body 1. As a result, even if a high-frequency signal is transmitted to the line conductor 3a, since the line conductor 3a is electrically grounded to the base body 1 at its entire length with stability, it is able to function as a micro-strip line or a strip line. This makes it possible to transmit the high-frequency signal satisfactorily while effectively preventing occurrence of electrical transmission loss of electric signals, such as return loss and insertion loss.

In a case where an optical semiconductor element, such as a semiconductor laser diode(LD) and/or a photodiode (PD), is fixedly emplaced on the placement portion 1a as the electronic component 5, as seen from the cross section of the package shown in FIG. 8, on one side surface of the frame body 2 is drilled a through hole 2b for input and output of optical signals. Then, a cylindrically shaped optical-fiber mounting member 8 is fixedly fitted into the through hole 2b by brazing or the like method. Note that FIG. 8 illustrates the cross section of the package shown in FIG. 7 in which the through hole 2b is drilled in one side wall of the frame body 2 opposite to the other side wall thereof having the input/output terminal 3 fitted therein. In FIG. 8, such constituent components as are common to those in FIG. 7 are represented by the same reference designations.

In this case, the front end of an optical fiber 9 fixedly supported by an annular optical-fiber supporting member 10 is inserted into the optical-fiber mounting member 8 from external to the package. Concurrently, the front end of the optical fiber 9 is positionally aligned so as to be optically coupled to the optical input/output portion of the electronic component 5. After that, the optical-fiber supporting member 10 is, at its end-face, joined to the side surface of the optical-fiber mounting member 8 external to the package by welding, brazing, or the like method. Thereupon, the optical-fiber supporting member 10 is attached to the package, with the front end of the optical fiber 9 kept optically coupled to the optical input/output portion of the electronic component 5. In this way, the optical-fiber supporting member 10 is joined to the package by way of the optical-fiber mounting member 8 by welding, brazing, or the like method. In consequence, even if a thermal stress is applied to the package when the optical-fiber supporting member 10 is joined to the package, the thermal stress can be absorbed and thereby eased off in the optical-fiber mounting member 8. This helps keep the input/output terminal 3 from being seriously subjected to the thermal stress and thereby avoid occurrence of damage therein such as a crack.

In a case where an optical semiconductor element is fixedly emplaced as the electronic component 5, as shown in FIG. 8, the through hole 2b should preferably be drilled in one side surface of the frame body 2 opposite to the other side surface thereof in which the mounting portion 2a is formed. In this structure, the line conductor 3a of the input/output terminal 3, the electronic component 5, and the optical fiber 9 are arranged in line, and thus the line conductor 3a and the light-emitting section or light-receiving section of the electronic component 5 can be linearly wired to each other. In other words, since there is no flection in the wiring between the line conductor 3a and the light-emitting section or light-receiving section of the electronic component 5, it never occurs that high-frequency signals traveling through the wiring suffer from electrical transmission loss at the flection, such as return loss and insertion loss. As a result, it is possible to effectively avoid occurrence of electrical transmission loss, such as return loss and insertion loss, of high-frequency signals traveling through the wiring between the line conductor 3a and the light-emitting section or light-receiving section of the electronic component 5, and thereby increase the high-frequency signal transmission efficiency. Note that the optical-fiber mounting member 8 and/or the optical-fiber supporting member 10 shall not necessarily have to be provided. For example, although not illustrated in the figures, the optical fiber 9 may be brazed directly to the inner surface of the through hole 2b using neither the optical-fiber mounting member 8 nor the optical-fiber supporting member 10. Or, in another alternative, the optical-fiber supporting member 10 may be bonded to the outer-side-surface around the opening of the through hole 2b by welding or brazing without using the optical-fiber mounting member 8.

As shown in FIG. 4A, the input/output terminal 3 is composed of the plate portion 3b having the line conductors 3a formed between the sides opposed to each other on the rectangular upper principal surface thereof; and an upright wall portion 3c disposed on the upper principal surface of the plate portion 3b so as to run across the line conductors 3a. The upright wall portion 3c provides insulation between the line conductor 3a and other metal, and also seals the package air-tightly. The plate portion 3b and the upright wall portion 3c are each made of a ceramic material such as an $Al_2O_3$-based sinter, an AlN-based sinter, or a $3Al_2O_3 \cdot 2SiO_2$-based sinter. The plate portion 3b and the upright wall portion 3c are fabricated as follows. For example, in the case of using the $Al_2O_3$-based sinter, at first, a suitable organic binder, organic solvent, plasticizer, or dispersant is admixed to powder of a base material such as alumina ($Al_2O_3$), silicon oxide ($SiO_2$), magnesium oxide (MgO), or calcium oxide (CaO), to form a slurry. The slurry is then formed into a plurality of ceramic green sheets by means of the conventionally-known doctor blade method.

Next, the ceramic green sheets thus obtained are subjected to appropriate stamping process to form the plate portion 3b and the upright wall portion 3c of the input/output terminal 3. Moreover, a suitable binder or solvent is admixed to powder of a metal such as W, Mo, Mn or composite of these metals to form a conductor paste. The conductor paste is print-coated onto the ceramic green sheets in predetermined patterns, by means of screen printing or the like method, to form conductor layers acting as for example the line conductors 3a which are electrically connected to the electrode of the electronic component 5. In addition, on a specific ceramic green sheet to be formed into one surface of the input/output terminal 3 that is bonded to the base body 1 as well as the frame body 2, a conductor layer (metallized layer) is formed to facilitate brazing.

These ceramic green sheets are stacked one on top of another in a predetermined order, are cut to a predetermined dimension, and are then fired at a temperature of approximately 1600° C. After that, the stacked body is cut to a predetermined size by means of a cutting edge with diamond, abrasive grain, etc., for example, a dicing saw or a slicer. Then, the top surface of the upright wall portion 3c is polished to a predetermined height so that the input/output terminal 3 can be fitted into the mounting portion 2a of the frame body 2 with high accuracy. Lastly, the top surface of the upright wall portion 3c, both end-faces 3e of the input/output terminal 3, and the side surface of the upright wall portion 3c to be bonded to the frame body 2 are each print-coated with the metal layer 3d made of a metal such as Mo or Mn, followed by performing firing at a temperature of approximately 1300° C. In this way, as the input/output terminal 3, a sintered body is produced that has conductor layers acting as the line conductors 3a, for example. In the input/output terminal 3, preferably, the exposed conductor layer, e.g. the line conductor 3a or the metal layer 3d has its surface coated with a metal layer such as a 0.5 to 9 $\mu$m-thick Ni layer and a 0.5 to 5 $\mu$m-thick Au layer by the plating method. This makes it possible not only to avoid oxidative corrosion but also to enhance the wire bondability and the solderability.

Note that the input/output terminal 3 is not limited to the configuration thus far described, but may be of another configuration so long as it fulfills the following requirements: the mounting portion 2a of the frame body 2 is stopped up by the input/output terminal 3; the frame body 2 is hermetically insulated from the exterior thereof; and the line conductor, which serves for conduction of electric signals between the electronic component 5 emplaced inside and an external electric circuit, is so disposed as to connect the interior and exterior of the frame body 2. For example, the input/output terminal 3 may be formed in the shape of a rectangular prism as a whole, and in which the line conductor 3a is formed so as to extend from one side surface to the other side surface thereof, with both ends of the line conductor 3a kept exposed.

Moreover, in the input/output terminal 3, the upright wall portion 3c may be formed either in the shape of the letter "U" as shown in FIG. 4A or in the shape of a rod (linearly) as shown in FIG. 4B, as viewed plane-wise. In the case of giving the upright wall portion 3c a rod-like shape as shown in FIG. 4B, the outer-side-surface pair 2c at the mounting portion 2a formed in the frame body 2 each assume a stepped side configuration ("L" configuration) instead of a rectangular side configuration as shown in FIG. 1.

In FIG. 1, the input/output terminal 3 is so configured that its opposed end-face pair 3e at two corners are made flush with the opposed outer-side-surface pair 2c including two corners of the frame body 2, or are each located between the outer-side-surface 2c and inner-side-surface 2d of the frame body 2. Besides, in the input/output terminal 3, the metal layer 3d is applied to both of the part of the end-face 3e which extends along the mounting portion 2a and the part thereof which extends along the base body 1. In this case, it is essential only that the metal layer 3d, which is applied to both end-faces 3e of the input/output terminal 3, be so shaped as to extend along the base body 1 as well as the frame body 2. Specifically, for example, as shown in FIG. 1, the metal layer 3d may be applied to substantially the entire area of each end-face 3e of the input/output terminal 3. Otherwise, as shown in FIG. 5, the metal layer 3d may be applied to only a part of each end-face 3e which extends along the joint portion with the base body 1 and a part thereof which extends along the joint portion with the frame body 2.

Preferably, as shown in FIG. 6, in the input/output terminal 3 which is rectangular-shaped as viewed plane-wise and has the line conductors 3a formed on its top surface, the metal layer 3d is applied to the entire area of the end-face 3e thereof, excluding the edge between the end-face 3e of the plate portion 3b of the input/output terminal 3 and a part of the plate portion 3b's top surface which is exposed outside the frame body 2, and also a part of the edge between the exposed surface of the upright wall portion 3c and the end-face 3e thereof which is located on the plate portion 3b side, namely, part of said edge close to the line conductor 3a. By applying the metal layer 3d in that way, even if the line conductor 3a is disposed in the vicinity of the end-face 3e of the plate portion 3b, it is possible to prevent electrical short-circuiting from occurring in the metal layer 3d at the end-face 3e. Another advantage is that an appropriate capacitance component can be secured between the line conductor 3a and the metal layer 3d.

On the other hand, in FIG. 7, the input/output terminal 3 is so configured that its opposed end-face pair 3e at two corners are located externally of the opposed outer-side-surface pair 2c including two corners of the frame body 2. Besides, in the input/output terminal 3, the metal layer 3d is applied to both of a part of the top surface which is fitted into the frame body 2 and part of the top surface external to the outer-side-surface pair 2c. In this case, the metal layer 3d needs to be formed at least on a part of the input/output terminal 3's top surface which is fitted into the frame body 2 and also part of the top surface thereof external to the outer-side-surface pair 2c.

As described just above, the input/output terminal 3 is so configured that its opposed end-face pair 3e at two corners are located externally of the opposed outer-side-surface pair 2c including two corners of the frame body 2. In addition to that, one surface of the upright wall portion 3c extending between the two corners, namely, as shown in FIG. 7, the outer side surface 3f of the upright wall portion 3c formed on the top surface of the plate portion 3b so as to run across the line conductor 3a, is situated externally of the outer side surface 2e of the frame body 2. It is preferable to apply the metal layer 3d also on the top surface of the upright wall portion 3c external to the outer side surface 2e of the frame body 2. This configuration makes it possible to prevent the brazing filler material from spreading wetly over the individual exposed surfaces of the input/output terminal 3, and thereby avoid formation of a clot of the brazing filler material effectively. Therefore, the input/output terminal 3 can be protected more effectively from damage such as a crack resulting from a stress ascribable to the difference in thermal expansion between the clot of the brazing filler material and itself.

Likewise, it is preferable to apply the metal layer 3d also on one side surface of the input/output terminal 3 which is bonded to the frame body 2 (one side surface located inwardly of the notch of the frame body 2 into which the input/output terminal 3 is fitted, namely, one side surface facing with the electronic component 5), and additionally on part of the bottom surface of the input/output terminal 3 to be bonded to the base body 1 which is situated externally of the outer-side-surface of the frame body 2.

The metal layer 3d may alternatively be applied to the entire top surface of the upright wall portion 3c. Otherwise, the metal layer 3d may be partly applied to the top surface of the upright wall portion 3c, that is; it may be applied thereto so as to extend from the joint portion with the frame body 2 to the region external to the outer-side-surface 2c of the frame body 2 only partway, not extending up to the end of the top surface of the upright wall portion 3c. Note that the metal layer 3d does not necessarily have to be applied to the entire top surface of the upright wall portion 3c from end to end. In this case, however, the metal layer 3d is required to have a width such that, of the brazing filler material used for bonding the top surface of the upright wall portion 3c to the frame body 2, an excess flowing out of the outer-side-surface of the frame body 2 is allowed to wetly spread sufficiently by the metal layer 3d, in consequence whereof there results no clot of the brazing filler material.

Moreover, in a case where the inner-side-surface of the upright wall portion 3c and the inner-side-surface 2d of the frame body 2 are in substantially the same plane and the thickness of the upright wall portion 3c, specifically the distance between its internal and external two side surfaces is made larger than the thickness of the frame body 2, then the upright wall portion 3c (the input/output terminal 3) has its end-face 3e located externally of the outer side surface 2c of the frame body 2. In this case, on the exposed top surface thereof, the metal layer 3d may be applied in a width larger than the thickness of the frame body 2 so as to extend externally of the outer side surface of the frame body 2. Further, on the other hand, in a case where the inner-side-surface of the upright wall portion 3c is situated between the inner-side-surface 2d and the outer-side-surface 2c of the frame body 2 and the thickness of the upright wall portion 3c is made substantially equal to or slightly smaller than the thickness of the frame body 2, then the upright wall portion 3c has its end-face 3e located externally of the outer side surface 2c of the frame body 2. Also in this case, on the exposed top surface thereof, the metal layer 3d may be applied so as to extend externally of the outer side surface 2c of the frame body 2.

By configuring the upright wall portion 3c in such a way that its inner-side-surface is situated externally of the inner-side-surface of the frame body 2, it is possible to increase the width of the input/output terminal 3's plate portion 3b having the line conductors 3a formed thereon. Correspondingly, on the top surface of the base body 1, the individual line conductors 3a can be made larger in width, and also they can be arranged at longer intervals.

Moreover, in the case where the input/output terminal 3 has its end-face 3e located externally of the outer-side-surface 2c of the frame body 2, the metal layer 3d may preferably be applied also to the end-face 3e of the input/output terminal 3. This configuration makes it possible to increase the area of the metal layer 3d in the input/output terminal 3, and thereby raise the level of the ground potential with respect to the line conductor 3a. Therefore, even if a high-frequency signal is transmitted to the line conductor 3a, electrical transmission loss of the high-frequency signal can be reduced further; wherefore highly efficient transmittal of high-frequency signals can be achieved. Further, in the input/output terminal 3, by applying the metal layer 3d of the top surface and the metal layer 3d of the end-face 3e contiguously with each other, it is possible to allow an excess of the brazing filler material to spread wetly over the metal layer 3d of the end-face 3e, too. This eliminates the need to secure a wider width for the metal layer 3d of the top surface.

Further, in this case, it is essential only that the metal layer 3d, which is applied to both end-faces 3e of the input/output terminal 3, be so shaped as to extend along the base body 1 as well as the frame body 2. Specifically, for example, as shown in FIG. 1, the metal layer 3d may be applied to substantially the entire area of each end-face 3e of the input/output terminal 3. Otherwise, as shown in FIG. 5, the metal layer 3d may be applied to only a part of each end-face 3e which extends along the joint portion with the base body 1 and a part thereof which extends along the joint portion with the frame body 2.

Furthermore, in the input/output terminal 3 which is rectangular-shaped as viewed plane-wise and has the line conductors 3*a* formed on its top surface, the metal layer 3*d* is applied to the entire area of the end-face 3*e* thereof, excluding the edge between the end-face 3*e* of the plate portion 3*b* of the input/output terminal 3 and a part of the plate portion 3*b*'s top surface which is exposed outside the frame body 2, and also a part of the edge between the exposed surface of the upright wall portion 3*c* and the end-face 3*e* thereof which is located on the plate portion 3*b* side, namely, part of said edge close to the line conductor 3*a*. By applying the metal layer 3*d* in that way, even if the line conductor 3*a* is disposed in the vicinity of the end-face 3*e* of the plate portion 3*b*, it is possible to prevent electrical short-circuiting from occurring in the metal layer 3*d* at the end-face 3*e*. Another advantage is that an appropriate capacitance can be secured between the line conductor 3*a* and the metal layer 3*d*.

In the package embodying the invention, as shown in FIG. 9, in a part of the input/output terminal 3 which is exposed outside the frame body 2, it is preferable that the line conductor 3*a* is formed on both of the top and bottom surfaces of the plate portion 3*b*. With this configuration, even if a multiplicity of line conductors 3*a*, which are respectively connected to the electronic component 5, are disposed finely on a part of the top surface of the input/output terminal 3's plate portion 3*b* which is situated inside the frame body 2, in the input/output terminal 3 external to the frame body 2, part of the line conductors 3*a* formed on its top surface can be routed to its bottom surface by way of an internal wiring. In this way, the line conductors 3*a* disposed on the top surface of the input/output terminal 3 external to the frame body 2, or on the bottom surface thereof, respectively, can be made smaller in number than the line conductors 3*a* disposed on the part of the top surface of the input/output terminal 3 which is situated inside the frame body 2. Correspondingly, in the input/output terminal 3 external to the frame body 2, the individual line conductors 3*a* can be made larger in width, and the adjacent line conductors 3*a* can be arranged at longer intervals.

As another advantage, in the input/output terminal 3 external to the frame body 2, even if a lead terminal 7 is bonded to each line conductor 3*a* with use of a conductive adhesive such as a brazing filler material, since as large a bonding area as possible can be secured between the line conductor 3*a* and the lead terminal 7, the lead terminal 7 can be attached to the input/output terminal 3 securely.

As still another advantage, even when the lead terminal 7 is bonded to the line conductor 3*a* with use of a conductive adhesive such as a brazing filler material, it never occurs that, in the region between the adjacent line conductors 3*a*, the molten portions of the conductive adhesive such as a brazing filler material stick to each other under the surface tension. Thus, electrical short-circuiting can be prevented from occurring in the adjacent line conductors 3*a* effectively.

Although not shown in the figures, by forming additionally a grounding metal layer between the line conductor 3*a* of the top surface of the plate portion 3*b* and the one of the bottom surface thereof, it is possible to avoid occurrence of cross talk in electric signals between the top-surface-side line conductor 3*a* and the bottom-surface-side line conductor 3*a*. Moreover, since the grounding metal layer acts as a grounding conductor layer for the individual line conductors 3*a*, it follows that the line conductors 3*a* each serve also as a micro-strip line. This allows high-frequency signals to be transmitted to the line conductors 3*a* satisfactorily.

As will be understood from the foregoing, even in the down-sized and integrated package in which a multiplicity of line conductors 3*a*, which are respectively connected to the electronic component 5, are disposed finely on the part of the top surface of the input/output terminal 3 which is situated inside the frame body 2, in the input/output terminal 3 external to the frame body 2, the line conductor 3*a* can be given a width large enough to achieve proper connection with the external electric circuit board.

The line conductor 3*a* formed on the top surface of the input/output terminal 3's plate portion 3*b* may be electrically connected to the wiring conductor formed on one principal surface of the external electric circuit board. Likewise, the line conductor 3*a* formed on the bottom surface of the input/output terminal 3 may be electrically connected to the wiring conductor formed on one principal surface of the external electric circuit board. This makes it possible to mount the package in the external electric circuit board with enhanced workability. Moreover, by attaching the lead terminal 7 to each of the line conductors 3*a* formed on the top and bottom surfaces of the input/output terminal 3, the external electric circuit board can be held between the top-surface-side lead terminal 7 and the bottom-surface-side lead terminal 7. This makes it possible to mount the package in each of the line conductors formed on the top and bottom surfaces of the external electric circuit board with quite highly efficient workability.

In the case of forming the line conductor 3*a* on both of the top and bottom surfaces of the plate portion 3*b*, in FIG. 9, it is preferable to keep the lower part of the input/output terminal 3 external to the frame body 2 free of the base body 1. In this structure, even if the input/output terminal 3 is disposed at the lower end of the frame body 2, there is no risk of the line conductor 3*a* and the base body 1 suffering from electrical short-circuiting. Moreover, the base body 1 could never be a hindrance when the package is mounted in the external electric circuit board.

Alternatively, by joining the same insulating material as the upright wall portion 3*c* also onto the bottom surface of the plate portion 3*b*, it is also possible to avoid occurrence of electrical short-circuiting between the line conductor 3*a* formed on the bottom surface of the plane portion 3*b* and the base body 1.

In the input/output terminal 3 such as shown herein, the metal layer 3*d* to be applied to the end-face 3*e* should preferably be applied to the entire area of the end-face 3*e* thereof, excluding the edge between the end-face 3*e* and a part of the plate portion 3*b*'s top surface which is exposed outside the frame body 2, as well as the edge between the end-face 3*e* and the part of the plate portion 3*b*'s bottom surface which is exposed outside the frame body 2, and also a part of the edge between the exposed surface of the upright wall portion 3*c* and the end-face 3*e* thereof which is located on the plate portion 3*b* side, namely, part of said edge close to the line conductor 3*a*. By applying the metal layer 3*d* in that way, even in the down-sized and integrated input/output terminal 3 in which the line conductors 3*a* are formed near the end-face 3*e* thereof, it is possible to avoid occurrence of electrical short-circuiting between the line conductor 3*a* and the metal layer 3*d* applied to the end-face 3*e* of the input/output terminal 3. Therefore, the area of the metal layer 3*d* applied to the end-face 3*e* of the input/output terminal 3 can be made as large as possible, and thus the ground potential with respect to the line conductor 3*a* can be intensified significantly. As a result, even if a high-frequency signal is transmitted to the line conductor 3*a*, occurrence of electrical transmission loss such as return loss or insertion loss can be prevented effectively; wherefore highly efficient transmittal of high-frequency signals can be achieved.

Moreover, in the case of configuring the input/output terminal 3 in such a way that its opposed end-face 3e pair at two corners are made flush with the opposed outer-side-surface pair including two corners of the frame body 2, or are each located between the outer-side-surface and inner-side-surface of the frame body 2, with the metal layer 3d applied to a part of the end-face 3e of the input/output terminal 3 which extends along the mounting portion 2a and a part thereof which extends along the base body 1, preferably, the metal layer 3d at each end-face 3e of the input/output terminal 3 has, on its surface, a plurality of grooves extending in a direction perpendicular to the outer periphery of the end-face 3e of the input/output terminal 3. Likewise, in the case of configuring that the input/output terminal 3 is so configured that its opposed end-face pair 3e at two corners are located externally of the opposed outer-side-surface pair 2c including two corners of the frame body 2, and besides, in the input/output terminal 3, the metal layer 3d is applied to both of a part of the top surface which is fitted into the frame body 2 and part of the top surface external to the outer-side-surface pair 2c, the metal layer 3d at each end-face 3e of the input/output terminal 3 has, on its surface, a plurality of grooves extending in a direction perpendicular to the outer periphery of the end-face 3e of the input/output terminal 3. This makes it possible to allow the brazing filler material, which flows out of the joint portion between the input/output terminal 3 and the base body 1 as well as the frame body 2, to spread wetly along the grooves quite sufficiently by exploiting a capillary phenomenon, and thereby prevent formation of a large clot of the brazing filler material more effectively.

Such a groove ranges in width and depth from 1 to 500 μm. For example, the groove can be created by pressing a die against a metal paste printed for constituting the metal layer 3d, or by rubbing the metal paste along a certain direction with a file paper having high surface roughness.

In conformity with the design thus far described, the package of the invention is constructed. In the input/output terminal 3 of the package, a pair of opposed end-faces 3e at two corners and/or the top surface of the upright wall portion 3c external to the outer-side-surface 2c of the frame body 2 are/is applied with the metal layer 3d. In this way, for example, as shown in FIGS. 3A and 3B, the brazing filler material used for bonding the input/output terminal 3 to the base body 1 as well as the frame body 2 is allowed to flow over the surface of the metal layer 3d so as not to remain in a part of the input/output terminal 3's end-face 3e which extends along the mounting portion 2a. Therefore, after the input/output terminal 3 is fixedly brazed to the base body 1 as well as the frame body 2, the input/output terminal 3 is no longer seriously affected, at its end-face 3e close to the joint portion with the base body 1 as well as the frame body 2, by the stress resulting from the difference in thermal expansion between the input/output terminal 3 and the brazing filler material.

As a result, several advantages are gained for the electronic component housing package: the input/output terminal 3 can be protected from damage such as a crack effectively; the package is hermetically insulated from the exterior thereof; the line conductor 3a formed on the input/output terminal 3 is free from a break; and the to-be-housed electronic component can be operated normally and stably for a longer period of time.

In addition, the metal layer 3d applied to the end-face 3e and/or the top surface of the input/output terminal 3 serves also as a ground potential with respect to the line conductor 3a. Thus, even if a high-frequency signal is transmitted to the line conductor 3a, occurrence of electrical transmission loss such as return loss and insertion loss can be prevented successfully; wherefore highly efficient transmittal of high-frequency signals can be achieved.

The line conductor 3a assumes a micro-strip structure with the base body 1 or a conductive metallized layer below the bottom surface of the input/output terminal 3. By determining the width of the line conductor 3a and the material and thickness of the input/output terminal 3's plate portion 3b appropriately, it is possible to improve the high-frequency transmission characteristics. More preferably, the line conductors 3a at the upright wall portion 3c internal and external to the frame body 2 and the line conductors 3a caught in the upright wall portion 3c are made differently in line width from one another.

Moreover, as shown in FIG. 6, in the input/output terminal 3, the metal layer 3d is applied to the entire area of the end-face 3e thereof, excluding the edge between the end-face 3e of the plate portion 3b and the part of the plate portion 3b's top surface which is exposed outside the frame body 2, as well as the edge between the end-face 3e and side surface of the upright wall portion 3c. By applying the metal layer 3d in that way, it is possible to make the area of the metal layer 3d applied to the end-face 3e of the input/output terminal 3 as large as possible. Further, even in the down-sized and integrated input/output terminal 3 in which the line conductors 3a are formed near the end-face 3e thereof, there is no risk of electrical short-circuiting occurring between the line conductor 3a and the metal layer 3d applied to the end-face 3e of the input/output terminal 3. Therefore, the input/output terminal 3 can be down-sized and integrated successfully, and the ground potential with respect to the line conductor 3a can be intensified significantly.

Specifically, as shown in FIG. 6, the edge between the top surface and end-face 3e of the plate portion 3b external to the frame body 2, and the edge between the principal surface and end-face 3e of the upright wall portion 3c external to the frame body 2 are each defined as a "metal layer 3d-free region". That is, the metal layer 3d is applied to the entire area of the end-face 3e of the input/output terminal 3, excluding the metal layer 3d-free regions. In this way, even if the line conductors 3a are formed near the end-face 3e of the plate portion 3b, electrical short-circuiting can be prevented from occurring between the line conductor 3a and the metal layer 3d (grounding conductor).

As the recent trend, the package has come to have an increasingly smaller size and to accommodate therein a larger and larger number of electronic components 5 or a large-scale integrated unit. Accompanying such miniaturization and increase in the degree of integration of the package, the line conductor 3a has been growing in number, which requires the line conductors 3a to be disposed close to the end-face 3e of the input/output terminal 3. In light of this, by providing the metal layer 3d-free regions at the edges of the input/output terminal 3, it is possible to prevent electrical short-circuiting from occurring between the line conductor 3a and the metal layer 3d (grounding conductor) effectively.

It is preferable that the metal layer 3d-free region ranges in width approximately from 0.05 to 0.2 mm. In this case, occurrence of electrical transmission loss such as return loss and insertion loss can be prevented effectively; wherefore highly efficient transmittal of high-frequency signals can be achieved. Moreover, electrical short-circuiting can be prevented from occurring between the line conductor 3a and the metal layer 3d effectively. If the width of the metal layer 3$d$-free region is less than 0.05 mm, the width is so narrow that, at the time of print-coating a conductor paste for constituting the line conductor 3$a$ and the metal layer 3$d$, the conductor paste spreads untowardly. This may cause electrical short-circuiting between the line conductor 3$a$ and the metal layer 3$d$. By contrast, if the width of the metal layer 3$d$-free region is greater than 0.2 mm, the width is so great that the area of the metal layer 3$d$ becomes unduly small relative to the total area of the input/output terminal 3's end-face 3$e$. This makes it impossible to intensify the ground potential sufficiently, which leads to occurrence of electrical transmission loss such as return loss and insertion loss.

As described heretofore, in the recent-model compact package incorporating the large-scale integrated electronic component 5, even if a high-frequency signal is transmitted to the line conductor 3$a$, occurrence of electrical transmission loss such as return loss and insertion loss can be prevented effectively; wherefore highly efficient transmittal of high-frequency signals can be achieved.

Thence, the electronic apparatus for commercial use is fabricated as follows. As shown in FIGS. 1 to 9, firstly, on the placement portion 1$a$ of the package is fixedly emplaced the electronic component 5, such as a semiconductor element, a piezoelectric oscillator, or an optical element, with use of a solder such as lead (Pb)-tin (Sn) solder or Au—Sn solder. Subsequently, the electrode of the electronic component 5 is electrically connected to a part of the line conductor 3$a$ which is situated inside the frame body 2 by electrical connecting means 6 such as a bonding wire. Lastly, a lid body 4 made of a metal such as an Fe—Ni—Co alloy or ceramics is attached to the top surface of the frame body 2 by soldering, welding, or the like method, thereby sealing the electronic component 5 air-tightly. Thereupon, an electronic apparatus as a product is realized.

Note that the electronic component 5 may be mounted on a circuit board composed of an insulating material such as an aluminum nitride (AlN) (not shown), or may be mounted on a thermoelectric cooler using a Peltier element, etc. (not shown), before being fixedly emplaced on the placement portion 1$a$. In this case, heat emanating from the electronic component 5 can be dissipated to the outside efficiently; wherefore the electronic component 5 can be prevented effectively from malfunctioning due to temperature rise.

Further, the line conductor 3$a$ external to the frame body 2 is soldered to a lead terminal made of an Fe—Ni—Co alloy, Fe—Ni alloy, or the like metal, or is connected with a bonding wire. Thereby, the line conductor 3$a$ is electrically connected to the external electric circuit board. In this way, the external electric circuit board and the electronic component 5 can be electrically connected to each other by way of the line conductor 3$a$ and the electrical connecting means 6. Upon receipt of an electric signal fed from the external electric circuit board, or upon transmission of an electric signal to the external electric circuit board, the electronic component 5 is activated.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An electronic component housing package comprising:
    a base body made of a metal that has, on its upper principal surface, a placement portion for emplacing thereon an electronic component;
    a rectangular-shaped frame body made of a metal disposed on the upper principal surface of the base body so as to surround the placement portion;
    an input/output terminal composed of an insulating material that has a line conductor for electrically conductively connecting an interior and exterior of the frame body; and
    an input/output terminal mounting portion into which the input/output terminal is fitted and which is formed as a notch extending across two adjacent corners of a lower part of the frame body,
    wherein the input/output terminal is so configured that its opposed end-face pair at two corners are made flush with opposed outer-side-surface pair including two corners of the frame body, or are each located between the outer side surface and inner side surface of the frame body,
    and wherein, in the input/output terminal, a metal layer is applied to both of a part of the end-face which extends along the input/output terminal mounting portion and a part thereof which extends along the base body, respectively.

2. The electronic component housing package of claim 1, wherein the metal layer is applied to substantially the entire area of the end-face of the input/output terminal.

3. The electronic component housing package of claim 1, wherein the input/output terminal is rectangular-shaped as viewed plane-wise, the line conductor is formed on a top surface of the input/output terminal, and the metal layer is applied to substantially the entire area of the end-face of the input/output terminal, excluding an edge between the end-face and a part of the top surface of the input/output terminal which is exposed outside the frame body.

4. The electronic component housing package of claim 3, wherein the metal layer is applied to only a part of the end-face of the input/output terminal which extends along the joint portion with the base body and a part thereof which extends along the joint portion with the frame body.

5. The electronic component housing package of claim 1, wherein the input/output terminal is rectangular-shaped, as viewed plane-wise, the line conductor is formed a top surface and a bottom surface of the input/output terminal, and the metal layer is applied to substantially the entire area of the end-face of the input/output terminal, excluding an edge between the end-face and a part of the top surface which is exposed outside the frame body as well as an edge between the end-face and a part of the bottom surface which is exposed outside the frame body.

6. The electronic component housing package of claim 1, wherein the metal layer has, on its surface, a plurality of grooves extending in a direction perpendicular to an outer periphery of the end-face of the input/output terminal.

7. An electronic apparatus comprising:
    the electronic component housing package of claim 1;
    an electronic component emplaced on the placement portion and electrically connected to the line conductor; and
    a lid body attached to the top surface of the frame body.

8. An electronic component housing package comprising:
    a base body made of a metal that has, on its upper principal surface, a placement portion for emplacing thereon an electronic component;

a rectangular-shaped frame body made of a metal disposed on the upper principal surface of the base body so as to surround the placement portion;

an input/output terminal mounting portion formed as a notch extending across two adjacent corners of a lower part of the frame body; and an input/output terminal composed of an insulating material having a line conductor for electrically conductively connecting an interior and exterior of the frame body; and an input/output terminal mounting portion into which the input/output terminal is fitted and which is formed as a notch extending across two adjacent corners of a lower part of the frame body, wherein the input/output terminal is so configured that its opposed end-face pair at two corners are located externally of opposed outer-side-surface pair including two corners of the frame body, and wherein, in the input/output terminal, a metal layer is applied to both of a part of the top surface which is fitted into the frame body and a part thereof which is located externally of the outer-side-surface pair.

9. The electronic component housing package of claim 8, wherein the metal layer is applied to substantially the entire area of the end-face of the input/output terminal.

10. The electronic component housing package of claim 8, wherein the input/output terminal is composed of a plate portion having the line conductor formed on its top surface and a upright wall portion formed on the plate portion, and is rectangular-shaped as viewed plane-wise, and the metal layer is applied to the entire area of the end-face of the input/output terminal, excluding an edge between the end-face and a part of the top surface of the plate portion which is exposed outside the frame body.

11. The electronic component housing package of claim 8, wherein the input/output terminal is composed of a plate portion having the line conductors formed on its top and bottom surfaces and a upright wall portion formed on the plate portion, and is rectangular-shaped as viewed plane-wise, and the metal layer is applied to the entire area of the end-face of the input/output terminal, excluding an edge between the end-face and a part of the top surface of the plate portion which is exposed outside the frame body as well as an edge between the end-face and a part of the bottom surface which is exposed outside the frame body.

12. The electronic component housing package of claim 10, wherein the metal layer is applied to only a part of the end-face of the input/output terminal which extends along the joint portion with the base body and a part thereof which extends along the joint portion with the frame body.

13. The electronic component housing package of claim 8, wherein the metal layer has, on its surface, a plurality of grooves extending in a direction perpendicular to an outer periphery of the end-face of the input/output terminal.

14. An electronic apparatus comprising:
the electronic component housing package of claim 8;
an electronic component emplaced on the placement portion and electrically connected to the line conductor; and
a lid body attached to the top surface of the frame body.

* * * * *